United States Patent
Plesski et al.

(10) Patent No.: US 12,170,516 B2
(45) Date of Patent: Dec. 17, 2024

(54) FILTERS USING TRANSVERSLY-EXCITED FILM BULK ACOUSTIC RESONATORS WITH FREQUENCY-SETTING DIELECTRIC LAYERS

(71) Applicant: Murata Manufacturing Co., Ltd., Nagaokakyo (JP)

(72) Inventors: Viktor Plesski, Gorgier (CH); Soumya Yandrapalli, Lausanne (CH); Robert B. Hammond, Rockville, MD (US); Bryant Garcia, Mississauga (CA); Patrick Turner, Portola Valley, CA (US); Jesson John, Dublin, CA (US); Ventsislav Yantchev, Sofia (BG)

(73) Assignee: Murata Manufacturing Co., Ltd., Nagaokakyo (JP)

(*) Notice: Subject to any disclaimer, the term of this patent is extended or adjusted under 35 U.S.C. 154(b) by 0 days.

(21) Appl. No.: 18/476,865

(22) Filed: Sep. 28, 2023

(65) Prior Publication Data
US 2024/0022234 A1    Jan. 18, 2024

Related U.S. Application Data

(63) Continuation of application No. 17/317,754, filed on May 11, 2021, now Pat. No. 11,870,424, which is a
(Continued)

(51) Int. Cl.
*H03H 9/56* (2006.01)
*H03H 3/02* (2006.01)
(Continued)

(52) U.S. Cl.
CPC .............. *H03H 9/568* (2013.01); *H03H 3/02* (2013.01); *H03H 9/02015* (2013.01);
(Continued)

(58) Field of Classification Search
CPC ...... H03H 9/568; H03H 3/02; H03H 9/02015; H03H 9/02031; H03H 9/02062;
(Continued)

(56) References Cited

U.S. PATENT DOCUMENTS 5,631,515 A    5/1997    Mineyoshi et al.
5,705,399 A    1/1998    Larue
(Continued)

FOREIGN PATENT DOCUMENTS

CN    201893487 A    7/2011
JP    H06152299 A    5/1994
(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Adam D Houston
(74) *Attorney, Agent, or Firm* — ArentFox Shiff LLP

(57) ABSTRACT

Filter devices are disclosed. A filter device includes a piezoelectric plate comprising a supported portion, a first diaphragm, and a second diaphragm. The supported portion is attached to a substrate and the first and second diaphragms spans respective cavities in the substrate. A first interdigital transducer (IDT) has interleaved fingers on the first diaphragm. A second interdigital transducer (IDT) has interleaved fingers on the second diaphragm. A first dielectric layer is between the interleaved fingers of the first IDT, and a second dielectric layer is between the interleaved fingers of the second IDT. A thickness of the first dielectric layer is greater than a thickness of the second dielectric layer. The piezoelectric plate and the first and second IDTs are configured such that radio frequency signals applied to first and
(Continued)

DETAIL C second IDTs excite primary shear acoustic modes in the respective diaphragms.

20 Claims, 16 Drawing Sheets

Related U.S. Application Data continuation of application No. 17/109,812, filed on Dec. 2, 2020, which is a continuation-in-part of application No. 16/689,707, filed on Nov. 20, 2019, now Pat. No. 10,917,070, which is a continuation of application No. 16/230,443, filed on Dec. 21, 2018, now Pat. No. 10,491,192.

(60) Provisional application No. 62/753,815, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(51) Int. Cl.
*H03H 9/02* (2006.01)
*H03H 9/13* (2006.01)
*H03H 9/17* (2006.01)
*H10N 30/87* (2023.01)

(52) U.S. Cl.
CPC .... *H03H 9/02031* (2013.01); *H03H 9/02062* (2013.01); *H03H 9/02228* (2013.01); *H03H 9/132* (2013.01); *H03H 9/174* (2013.01); *H03H 9/176* (2013.01); *H03H 9/562* (2013.01); *H03H 9/564* (2013.01); *H03H 2003/023* (2013.01); *H03H 9/02039* (2013.01); *H10N 30/877* (2023.02)

(58) Field of Classification Search
CPC .... H03H 9/02228; H03H 9/132; H03H 9/174; H03H 9/176; H03H 9/562; H03H 9/564; H03H 9/02039; H03H 2003/023; H10N 30/877
See application file for complete search history.

(56) References Cited

U.S. PATENT DOCUMENTS

| | | | |
|---|---|---|---|
| 5,853,601 A | 12/1998 | Krishaswamy et al. | |
| 6,540,827 B1 | 4/2003 | Levy et al. | |
| 6,570,470 B2 | 5/2003 | Maehara et al. | |
| 6,670,866 B2 | 12/2003 | Ellaet et al. | |
| 6,707,229 B1 | 3/2004 | Martin | |
| 7,463,118 B2 | 12/2008 | Jacobsen | |
| 7,535,152 B2 | 5/2009 | Ogami et al. | |
| 7,554,427 B2 | 6/2009 | Matsumoto et al. | |
| 7,684,109 B2 | 3/2010 | Godshalk et al. | |
| 7,802,466 B2 | 9/2010 | Whalen et al. | |
| 7,868,519 B2 | 1/2011 | Umeda | |
| 8,278,802 B1 | 10/2012 | Lee et al. | |
| 8,344,815 B2 * | 1/2013 | Yamanaka | H03H 9/643 333/196 |
| 8,829,766 B2 | 9/2014 | Milyutin et al. | |
| 8,932,686 B2 | 1/2015 | Hayakawa et al. | |
| 9,130,145 B2 | 9/2015 | Martin et al. | |
| 9,154,111 B2 | 10/2015 | Bradley et al. | |
| 9,219,466 B2 | 12/2015 | Meltaus et al. | |
| 9,276,557 B1 | 3/2016 | Nordquist et al. | |
| 9,369,105 B1 | 6/2016 | Li | |
| 9,425,765 B2 | 8/2016 | Rinaldi | |
| 9,525,398 B1 | 12/2016 | Olsson | |
| 9,640,750 B2 | 5/2017 | Nakanishi et al. | |
| 9,748,923 B2 | 8/2017 | Kando et al. | |
| 9,780,759 B2 | 10/2017 | Kimura et al. | |
| 10,187,039 B2 | 1/2019 | Komatsu et al. | |
| 10,200,013 B2 | 2/2019 | Bower et al. | |
| 10,284,176 B1 | 5/2019 | Solal | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,826,462 B2 * | 11/2020 | Plesski | H03H 9/02157 |
| 11,482,981 B2 * | 10/2022 | Fenzi | H03H 9/568 |
| 2002/0079986 A1 | 6/2002 | Ruby et al. | |
| 2002/0158714 A1 | 10/2002 | Kaitila et al. | |
| 2003/0199105 A1 | 10/2003 | Kub et al. | |
| 2004/0090145 A1 | 5/2004 | Bauer et al. | |
| 2004/0261250 A1 | 12/2004 | Kadota et al. | |
| 2006/0125489 A1 | 6/2006 | Feucht et al. | |
| 2006/0152107 A1 | 7/2006 | Tanaka | |
| 2006/0222568 A1 | 10/2006 | Wang et al. | |
| 2007/0170565 A1 | 7/2007 | Hong et al. | |
| 2007/0194863 A1 | 8/2007 | Shibata et al. | |
| 2008/0018414 A1 | 1/2008 | Inoue et al. | |
| 2008/0297280 A1 | 12/2008 | Thalhammer et al. | |
| 2009/0273415 A1 | 11/2009 | Frank et al. | |
| 2010/0064492 A1 | 3/2010 | Tanaka | |
| 2010/0123367 A1 | 5/2010 | Tai et al. | |
| 2010/0212127 A1 | 8/2010 | Heinze et al. | |
| 2010/0301703 A1 | 12/2010 | Chen et al. | |
| 2011/0109196 A1 | 5/2011 | Goto | |
| 2011/0278993 A1 | 11/2011 | Iwamoto | |
| 2013/0015353 A1 | 1/2013 | Tai et al. | |
| 2013/0234805 A1 | 9/2013 | Takahashi | |
| 2013/0321100 A1 | 12/2013 | Wang | |
| 2014/0001919 A1 | 1/2014 | Komatsu | |
| 2014/0009032 A1 | 1/2014 | Takahashi et al. | |
| 2014/0113571 A1 | 4/2014 | Fujiwara | |
| 2014/0145556 A1 | 5/2014 | Kadota | |
| 2014/0151151 A1 | 6/2014 | Reinhardt | |
| 2014/0152145 A1 * | 6/2014 | Kando | H03H 9/02574 29/25.35 |
| 2014/0173862 A1 | 6/2014 | Kando et al. | |
| 2014/0218129 A1 | 8/2014 | Fujiwara | |
| 2014/0225684 A1 | 8/2014 | Kando et al. | |
| 2015/0319537 A1 * | 11/2015 | Perois | H04R 17/00 381/190 |
| 2015/0333730 A1 | 11/2015 | Meltaus | |
| 2016/0028367 A1 | 1/2016 | Shealy | |
| 2016/0079958 A1 | 3/2016 | Burak | |
| 2016/0149554 A1 | 5/2016 | Nakagawa | |
| 2016/0182009 A1 | 6/2016 | Bhattacharjee | |
| 2016/0301382 A1 | 10/2016 | Iwamoto | |
| 2017/0063332 A1 | 3/2017 | Gilbert et al. | |
| 2017/0104470 A1 | 4/2017 | Koelle et al. | |
| 2017/0170808 A1 | 6/2017 | Iwaki et al. | |
| 2017/0179928 A1 | 6/2017 | Raihn et al. | |
| 2017/0214387 A1 | 7/2017 | Burak et al. | |
| 2017/0222622 A1 | 8/2017 | Solal et al. | |
| 2017/0290160 A1 | 10/2017 | Takano et al. | |
| 2017/0324394 A1 | 11/2017 | Ebner et al. | |
| 2017/0370791 A1 | 12/2017 | Nakamura et al. | |
| 2018/0123016 A1 | 5/2018 | Gong et al. | |
| 2018/0152169 A1 | 5/2018 | Goto et al. | |
| 2018/0191322 A1 | 7/2018 | Chang et al. | |
| 2018/0262179 A1 | 9/2018 | Goto et al. | |
| 2018/0316333 A1 | 11/2018 | Nakamura et al. | |
| 2019/0068164 A1 | 2/2019 | Houlden et al. | |
| 2019/0131953 A1 | 5/2019 | Gong | |
| 2019/0148621 A1 | 5/2019 | Feldman et al. | |
| 2019/0181833 A1 | 6/2019 | Nosaka | |
| 2019/0207583 A1 | 7/2019 | Miura et al. | |
| 2019/0273480 A1 | 9/2019 | Lin | |
| 2019/0273481 A1 | 9/2019 | Michigami | |
| 2019/0341911 A1 | 11/2019 | Komatsu et al. | |
| 2019/0386636 A1 * | 12/2019 | Plesski | H03H 9/02031 |
| 2020/0007110 A1 | 1/2020 | Konaka et al. | |
| 2020/0021271 A1 | 1/2020 | Plesski | |

(56) References Cited

U.S. PATENT DOCUMENTS

| | | | |
|---|---|---|---|
| 2020/0177162 A1* | 6/2020 | Yantchev | H03H 9/02228 |
| 2020/0244247 A1 | 7/2020 | Maeda | |
| 2020/0287521 A1* | 9/2020 | Garcia | H03H 9/176 |
| 2020/0304091 A1 | 9/2020 | Yantchev | |
| 2020/0336130 A1 | 10/2020 | Turner | |
| 2020/0373907 A1 | 11/2020 | Garcia | |
| 2020/0382098 A1* | 12/2020 | Garcia | H03H 9/54 |
| 2020/0412330 A1* | 12/2020 | Garcia | H03H 9/02 |
| 2021/0006228 A1* | 1/2021 | Garcia | H03H 9/564 |
| 2021/0013859 A1* | 1/2021 | Turner | H03H 9/568 |
| 2021/0013868 A1 | 1/2021 | Plesski | |
| 2021/0091749 A1* | 3/2021 | Plesski | H03H 9/568 |
| 2021/0126619 A1 | 4/2021 | Wang et al. | |
| 2021/0152154 A1 | 5/2021 | Tang et al. | |
| 2021/0265978 A1* | 8/2021 | Plesski | H03H 3/02 |
| 2021/0273631 A1 | 9/2021 | Jachowski et al. | |
| 2021/0391844 A1* | 12/2021 | Plesski | H03H 9/564 |
| 2021/0399718 A1* | 12/2021 | Guyette | H03H 9/02031 |
| 2022/0021370 A1* | 1/2022 | Garcia | H03H 9/02102 |
| 2022/0021371 A1* | 1/2022 | Garcia | H03H 9/174 |
| 2022/0052669 A1 | 2/2022 | Bauer et al. | |
| 2022/0103160 A1 | 3/2022 | Jachowski | |
| 2022/0116014 A1 | 4/2022 | Poirel | |
| 2022/0116019 A1* | 4/2022 | McHugh | H03H 9/564 |
| 2022/0200569 A1* | 6/2022 | Garcia | H03H 9/564 |
| 2022/0209740 A1* | 6/2022 | Garcia | H03H 9/174 |
| 2022/0231661 A1 | 7/2022 | McHugh | |
| 2022/0393666 A1* | 12/2022 | Plesski | H03H 9/568 |
| 2023/0006633 A1* | 1/2023 | Dyer | H03H 9/54 |
| 2023/0015769 A1* | 1/2023 | Dittmann | A24F 40/10 |
| 2023/0034595 A1* | 2/2023 | Cardona | H03H 3/02 |
| 2023/0037168 A1* | 2/2023 | Cardona | H03H 9/171 |
| 2023/0041856 A1* | 2/2023 | Kay | H03H 9/13 |
| 2023/0111410 A1* | 4/2023 | Dyer | H03H 9/205 333/187 |
| 2023/0134889 A1* | 5/2023 | Costa | H03H 9/564 333/187 |
| 2023/0208393 A1* | 6/2023 | Garcia | H03H 9/02228 333/187 |
| 2023/0223915 A1* | 7/2023 | Koulakis | H03H 9/174 333/186 |
| 2023/0229284 A1* | 7/2023 | Bicek | G06F 3/04817 |
| 2023/0231534 A1* | 7/2023 | Dyer | H03H 9/02015 333/189 |
| 2023/0246631 A1* | 8/2023 | Dyer | H03H 9/133 333/187 |
| 2023/0337729 A1* | 10/2023 | Dittmann | A24F 40/48 |
| 2024/0118242 A1* | 4/2024 | Yatsuda | G01N 29/036 |

FOREIGN PATENT DOCUMENTS

| | | |
|---|---|---|
| JP | 10-209804 A | 8/1998 |
| JP | 2002300003 A | 10/2002 |
| JP | 2007251910 A | 9/2007 |
| JP | 2010103803 A | 5/2010 |
| JP | 2010-233210 A | 10/2010 |
| JP | 2012049758 A | 3/2012 |
| JP | 2013214954 A | 10/2013 |
| JP | 2015054986 A | 3/2015 |
| JP | 2016001923 A | 7/2016 |
| JP | 2017220910 A | 12/2017 |
| JP | 2018166259 A | 10/2018 |
| JP | 2018207144 A | 12/2018 |
| JP | 2019186655 A | 10/2019 |
| JP | 2020088459 A | 6/2020 |
| JP | 2020113939 A | 7/2020 |
| WO | 2013128636 A1 | 9/2013 |
| WO | 2015098694 A1 | 7/2015 |
| WO | 2016017104 A1 | 2/2016 |
| WO | 2016052129 A1 | 4/2016 |
| WO | 2016/147687 A1 | 9/2016 |
| WO | 2018003273 A1 | 1/2018 |
| WO | 2018079522 A1 | 5/2018 |
| WO | 2018163860 A1 | 9/2018 |
| WO | 2019138810 A1 | 7/2019 |
| WO | 2019241174 A1 | 12/2019 |
| WO | 2020092414 A2 | 5/2020 |
| WO | 2020175234 A1 | 9/2020 |
| WO | 2021060523 A1 | 4/2021 |
| WO | 2023002858 A1 | 1/2023 |
| WO | WO-2023081769 A1 * | 5/2023 ............... H03H 3/02 |

OTHER PUBLICATIONS

R. Olsson III, K. Hattar et al. "A high electromechanical coupling coefficient SH0 Lamb wave lithiumniobate Micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 Ghz Lithium Niobate Mems Resonators With High Fom of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A . . . (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y—cut X—propagation LiNbO3 plates." Electron. Comm. Jpn. Pt. 1, 69, No. 4 (1986): 47-55. doi: 10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary Meaning of "diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year 2008).

Material Properties of Tibtech Innovations, © 2018 Tibtech Innovations (Year 2018).

Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.

Wei Pang et al. "Analytical and experimental study on the second harmonic mode response of a bulk acoustic wave resonator" 2010 J. Micromech. Microeng. 20 115015; doi:10.1088/0960-1317/20/11/115015.

(56) References Cited

OTHER PUBLICATIONS

Durmus et al. "Acoustic-Based Biosensors" Encyclopedia of Microfluidics and Nanofluidics. DOI 10.1007/978-3-642-27758-0_10-2 Springer Science+Business Media New York 2014.
USPTO/ISA, International Search Report and Written Opinion for PCT Application No. PCT/US2023/017732 dated Jul. 27, 2023.
USPTO/ISA, International Search Report and Written Opinion for PCT Application No. PCT/US2022/082421 dated May 3, 2023.
USPTO/ISA, International Search Report and Written Opinion for PCT Application No. PCT/US2022/081095 dated May 30, 2023.
USPTO/ISA, International Search Report and Written Opinion for PCT Application No. PCT/US2022/079236 dated Mar. 10, 2023.
USPTO/ISA, International Search Report and Written Opinion for PCT Application No. PCT/US2022/081068 dated Apr. 18, 2023.
USPTO/ISA, International Search Report and Written Opinion for PCT Application No. PCT/US2022/080246 dated Mar. 30, 2023.

* cited by examiner

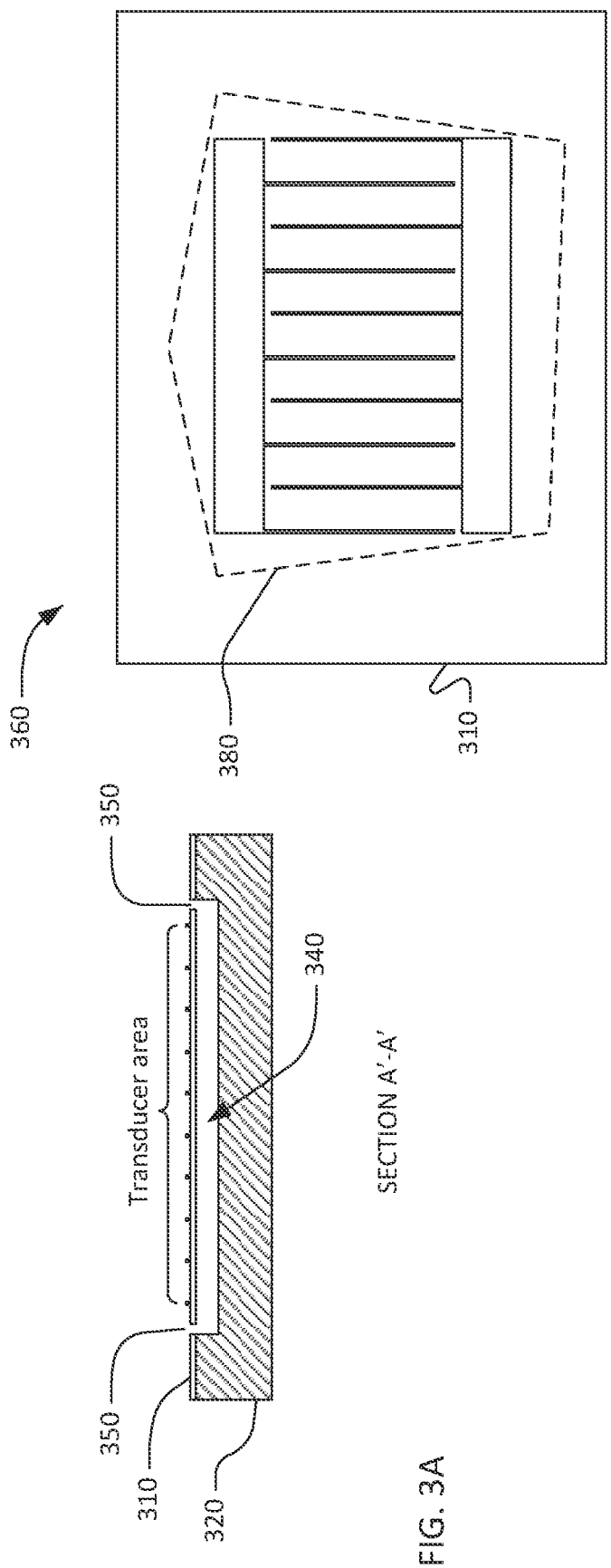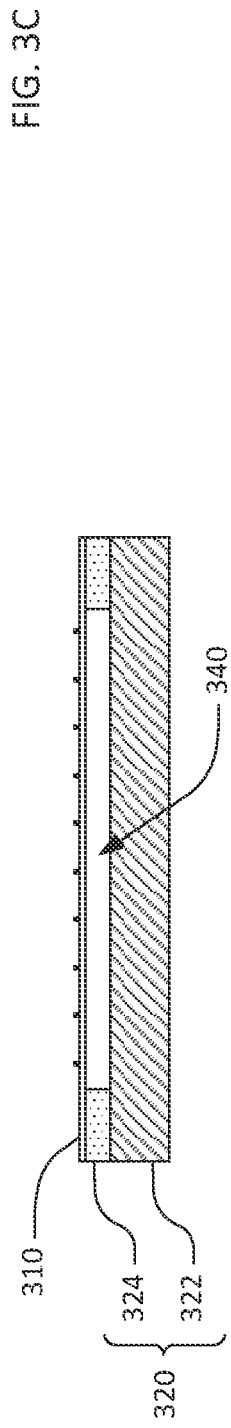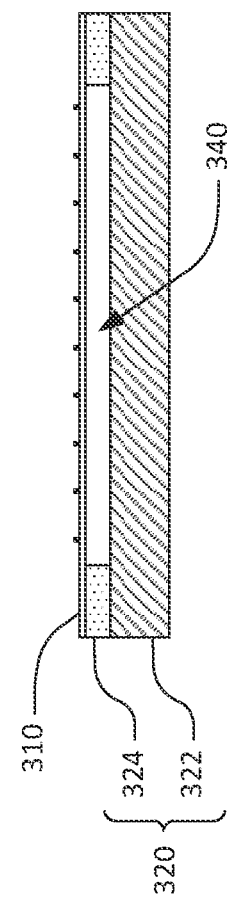

FILTERS USING TRANSVERSLY-EXCITED FILM BULK ACOUSTIC RESONATORS WITH FREQUENCY-SETTING DIELECTRIC LAYERS

CROSS REFERENCE TO RELATED APPLICATION INFORMATION

This patent application is a continuation of U.S. patent application Ser. No. 17/317,754, filed May 11, 2011, which is a continuation of U.S. patent application Ser. No. 17/109,812, filed Dec. 2, 2020, which is a continuation-in-part of U.S. patent application Ser. No. 16/689,707, filed Nov. 20, 2019, now U.S. Pat. No. 10,917,070, which is a continuation of U.S. patent application Ser. No. 16/230,443, filed Dec. 21, 2018, now U.S. Pat. No. 10,491,192, which claims priority from the following provisional patent applications: U.S. Application No. 62/685,825, filed Jun. 15, 2018, entitled SHEAR-MODE FBAR (XBAR); U.S. Application No. 62/701,363, filed Jul. 20, 2018, entitled SHEAR-MODE FBAR (XBAR); U.S. Application No. 62/741,702, filed Oct. 5, 2018, entitled 5 GHZ LATERALLY-EXCITED BULK WAVE RESONATOR (XBAR); U.S. Application No. 62/748,883, filed Oct. 22, 2018, entitled SHEAR-MODE FILM BULK ACOUSTIC RESONATOR; and U.S. Application No. 62/753,815, filed Oct. 31, 2018, entitled LITHIUM TANTALATE SHEAR-MODE FILM BULK ACOUSTIC RESONATOR. The entirety of each of these applications are incorporated herein by reference.

TECHNICAL FIELD

This disclosure relates to radio frequency filters using acoustic wave resonators, and specifically to filters for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

BRIEF DESCRIPTION OF THE DRAWINGS

FIG. 3A is an alternative schematic cross-sectional view of the XBAR of FIG. 1.

FIG. 3B is another alternative schematic cross-sectional view of the XBAR of FIG. 1.

FIG. 3C is an alternative schematic plan view of an XBAR.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
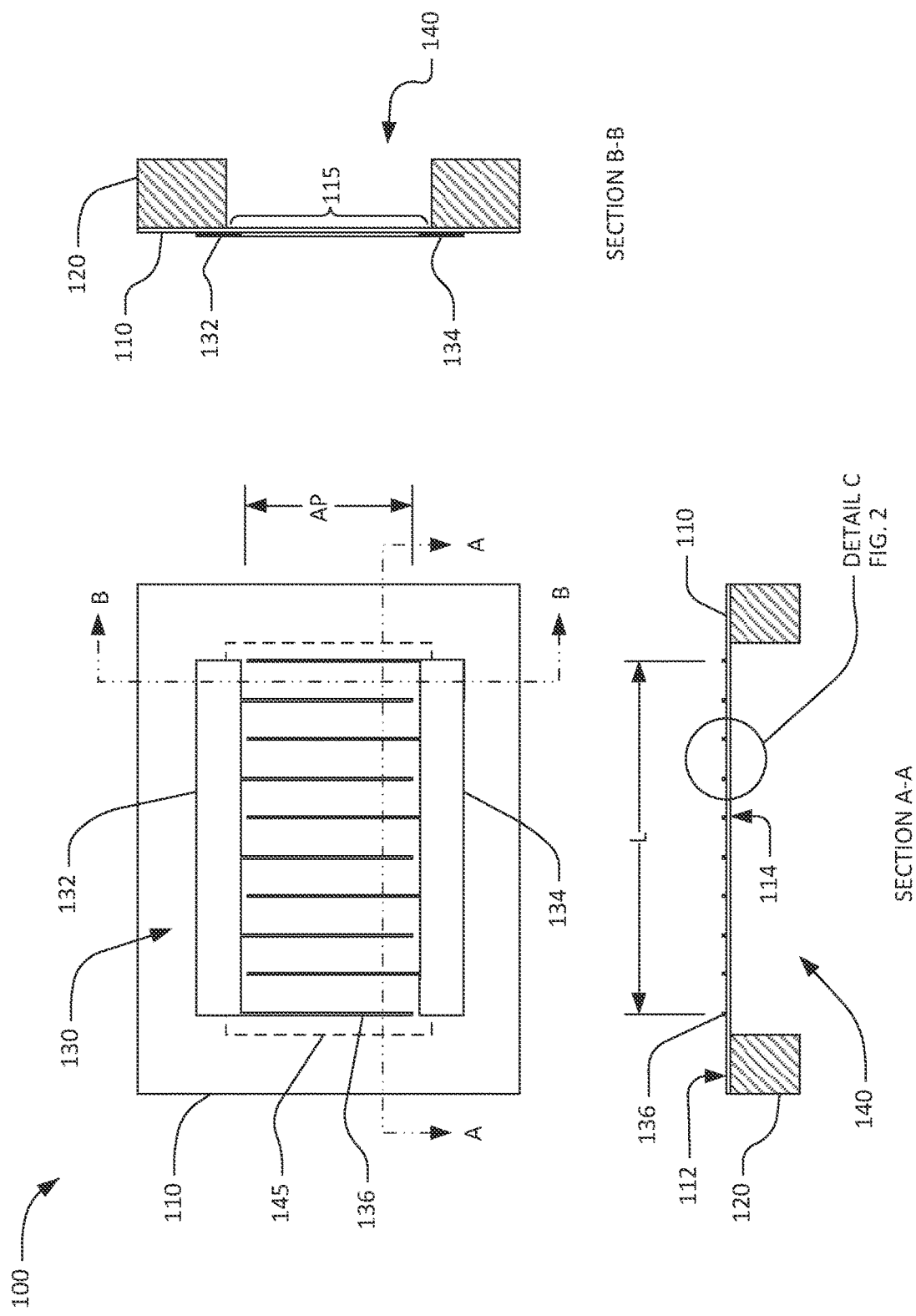
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having substantially parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the surfaces. However, XBARs may be fabricated on piezoelectric plates with other crystallographic orientations including rotated Z-cut and rotated Y-cut.

A portion of the back surface 114 of the piezoelectric plate 110 is attached to a substrate 120 that provides mechanical support to the piezoelectric plate 110. A cavity 140 is formed in the substrate. "Cavity" has its conventional meaning of "an empty space within a solid body." The cavity 140 may be a hole completely through the substrate 120 (as shown in Section A-A and Section B-B) or a recess in the substrate 120. The cavity 140 may be formed, for example, by selective etching of the substrate 120. The dashed line 145 in the plan view is the perimeter of the cavity 140, which is defined by the intersection of the cavity and the back surface 114 of the piezoelectric plate 110. As shown in FIG. 1, the perimeter 145 of the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion of the piezoelectric plate 110 outside of the perimeter of the cavity 145 is attached to the substrate. This portion may be referred to as the "supported portion" of the piezoelectric plate. The portion 115 of the piezoelectric plate 110 within the perimeter of the cavity 145 is suspended over the cavity 140 without contacting the substrate 120. The portion 115 of the piezoelectric plate 110 that spans the cavity 140 will be referred to herein as the "diaphragm" 115 due to its similarity to the diaphragm of a microphone.

The substrate 120 may be, for example, silicon, sapphire, quartz, or some other material. The supported portion of the piezoelectric plate 110 may be bonded to the substrate 120 using a wafer bonding process, or grown on the substrate 120, or attached to the substrate in some other manner. The piezoelectric plate may be attached directly to the substrate or may be attached to the substrate via one or more intermediate material layer.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The term "busbar" is commonly used to identify the electrodes that connect the fingers of an IDT. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites an acoustic wave within the piezoelectric plate 110. As will be discussed in further detail, the excited acoustic wave is a bulk shear wave that propagates in the direction normal to the surface of the piezoelectric plate 110, which is also normal, or transverse, to the direction of the electric field created by the IDT fingers. Thus, the XBAR is considered a transversely-excited film bulk wave resonator.

The rectangular area defined by the length L and the aperture AP is considered the "transducer area". Substantially all the conversion between electrical and acoustic energy occurs within the transducer area. The electric fields formed by the IDT may extend outside of the transducer area. The acoustic waves excited by the IDT are substantially confined within the transducer area. Small amounts of acoustic energy may propagate outside of the transducer area in both the length and aperture directions. In other embodiments of an XBAR, the transducer area may be shaped as a parallelogram or some other shape rather than rectangular. All the overlapping portions of the IDT fingers and the entire transducer area are positioned on the diaphragm 115, which is to say within the perimeter of the cavity defined by the dashed line 145.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 130. An XBAR may have hundreds, possibly thousands, of parallel fingers in the IDT 130. Similarly, the thickness of the fingers in the cross-sectional views is greatly exaggerated.

Figure 2:
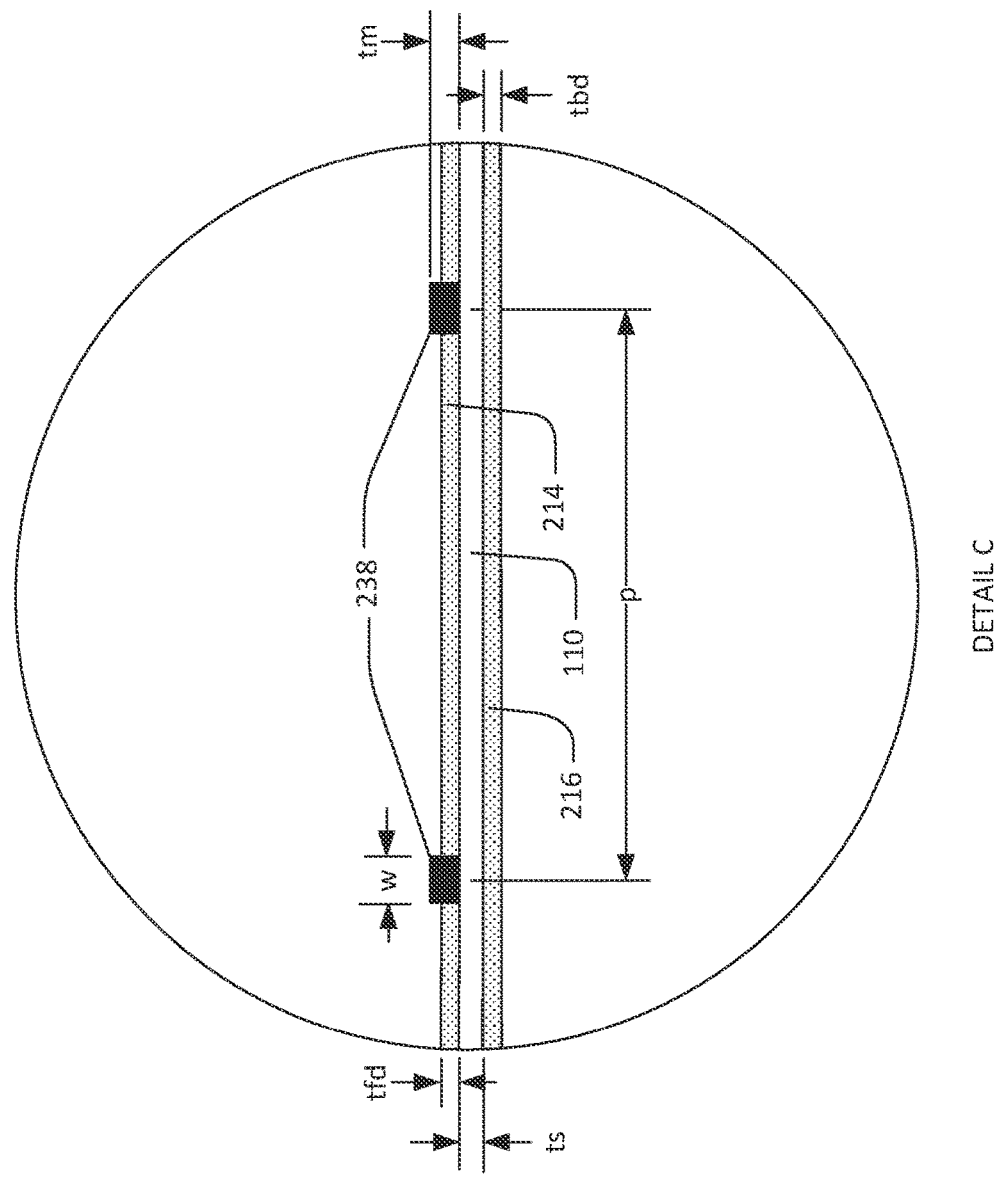
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness ts.

ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be one or more layers of aluminum or a substantially aluminum alloy, copper or a substantially copper alloy, beryllium, titanium, tungsten, chromium, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2.5 to 10 times the width w of the fingers. In addition, the pitch p of the IDT is typically 2.5 to 25 times the thickness ts of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

FIG. 3A and FIG. 3B show two alternative cross-sectional views along the section plane A-A defined in FIG. 1. In FIG. 3A, a piezoelectric plate 310 is attached to a substrate 320. A cavity 340, which does not fully penetrate the substrate 320, is formed in the substrate under the portion of the piezoelectric plate 310 containing the IDT of an XBAR. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 350 provided in the piezoelectric plate 310.

In FIG. 3B, the substrate 320 includes a base 322 and an intermediate layer 324 disposed between the piezoelectric plate 310 and the base 322. For example, the base 322 may be silicon and the intermediate layer 324 may be silicon dioxide or silicon nitride or some other material. A cavity 340 is formed in the intermediate layer 324 under the portion of the piezoelectric plate 310 containing the IDT of an XBAR. The cavity 340 may be formed, for example, by etching the intermediate layer 324 before attaching the piezoelectric plate 310. Alternatively, the cavity 340 may be formed by etching the intermediate layer 324 with a selective etchant that reaches the substrate through one or more openings provided in the piezoelectric plate 310.

FIG. 3C is a schematic plan view of another XBAR 360. The XBAR 360 includes an IDT formed on a piezoelectric plate 310. The piezoelectric plate 310 is disposed over a cavity 380 in a substrate. In this example, the cavity 380 has an irregular polygon shape such that none of the edges of the cavity are parallel, nor are they parallel to the conductors of the IDT. A cavity may have a different shape with straight or curved edges.

Figure 4:
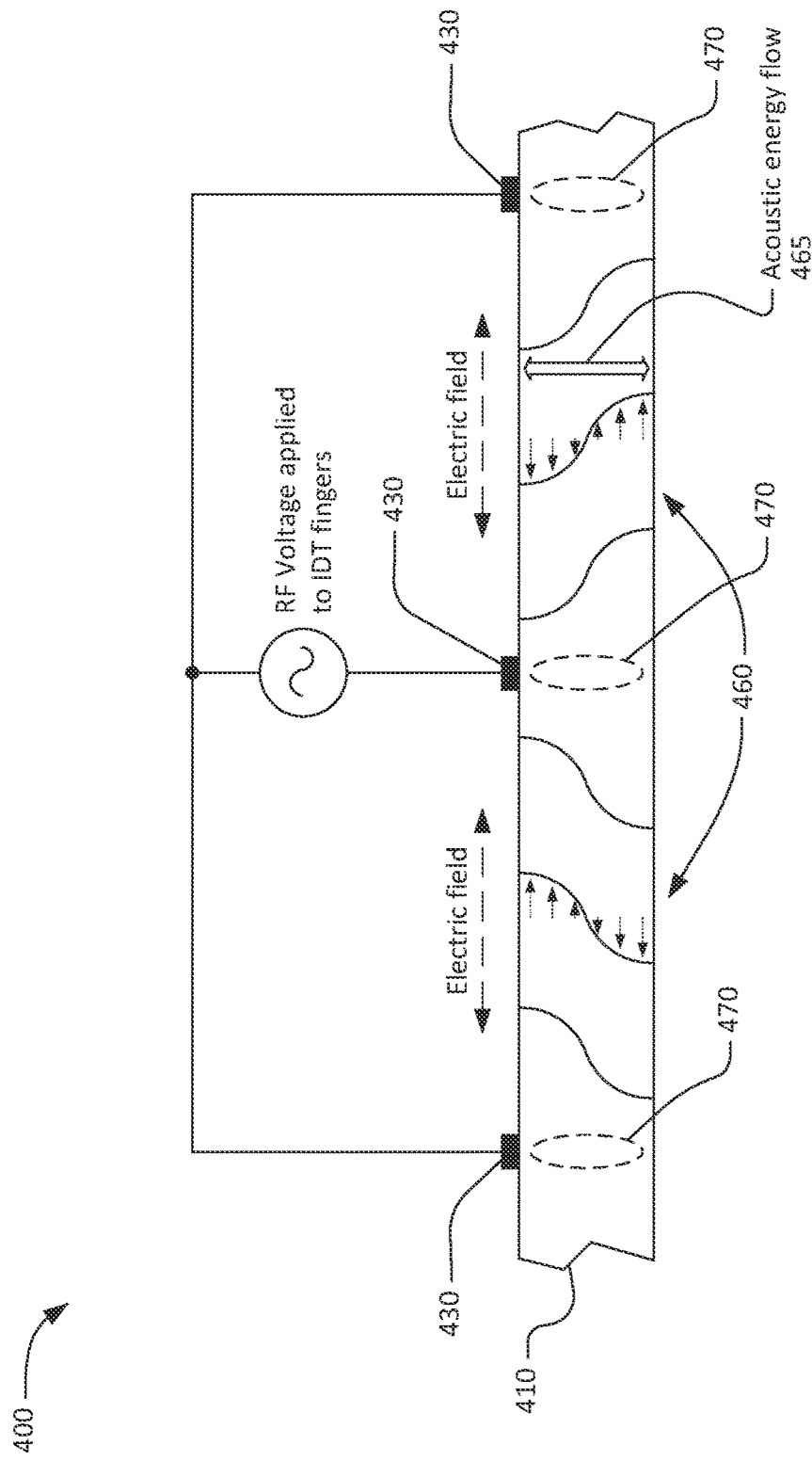
FIG. 4 is a graphic illustrating a shear horizontal acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. An RF voltage is applied to the interleaved fingers 430. This voltage creates a time-varying electric field between the fingers. The direction of the electric field is lateral, or parallel to the surface of the piezoelectric plate 410, as indicated by the arrows labeled "electric field". Due to the high dielectric constant of the piezoelectric plate, the electric field is highly concentrated in the plate relative to the air. The lateral electric field introduces shear deformation, and thus strongly excites shear-mode acoustic waves, in the piezoelectric plate 410. In this context, "shear deformation" is defined as deformation in which parallel planes in a material remain parallel and maintain a constant distance while translating relative to each other. "Shear acoustic waves" are defined as acoustic waves in a medium that result in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited shear acoustic waves is substantially vertical, normal to the surface of the piezoelectric plate, as indicated by the arrow 465.

Considering FIG. 4, there is essentially no electric field immediately under the IDT fingers 430, and thus acoustic modes are only minimally excited in the regions 470 under the fingers. There may be evanescent acoustic motions in these regions. Since acoustic vibrations are not excited under the IDT fingers 430, the acoustic energy coupled to the IDT fingers 430 is low (for example compared to the fingers of an IDT in a SAW resonator), which minimizes viscous losses in the IDT fingers.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. Thus high piezoelectric coupling enables the design and implementation of microwave and millimeter-wave filters with appreciable bandwidth.

Figure 5:
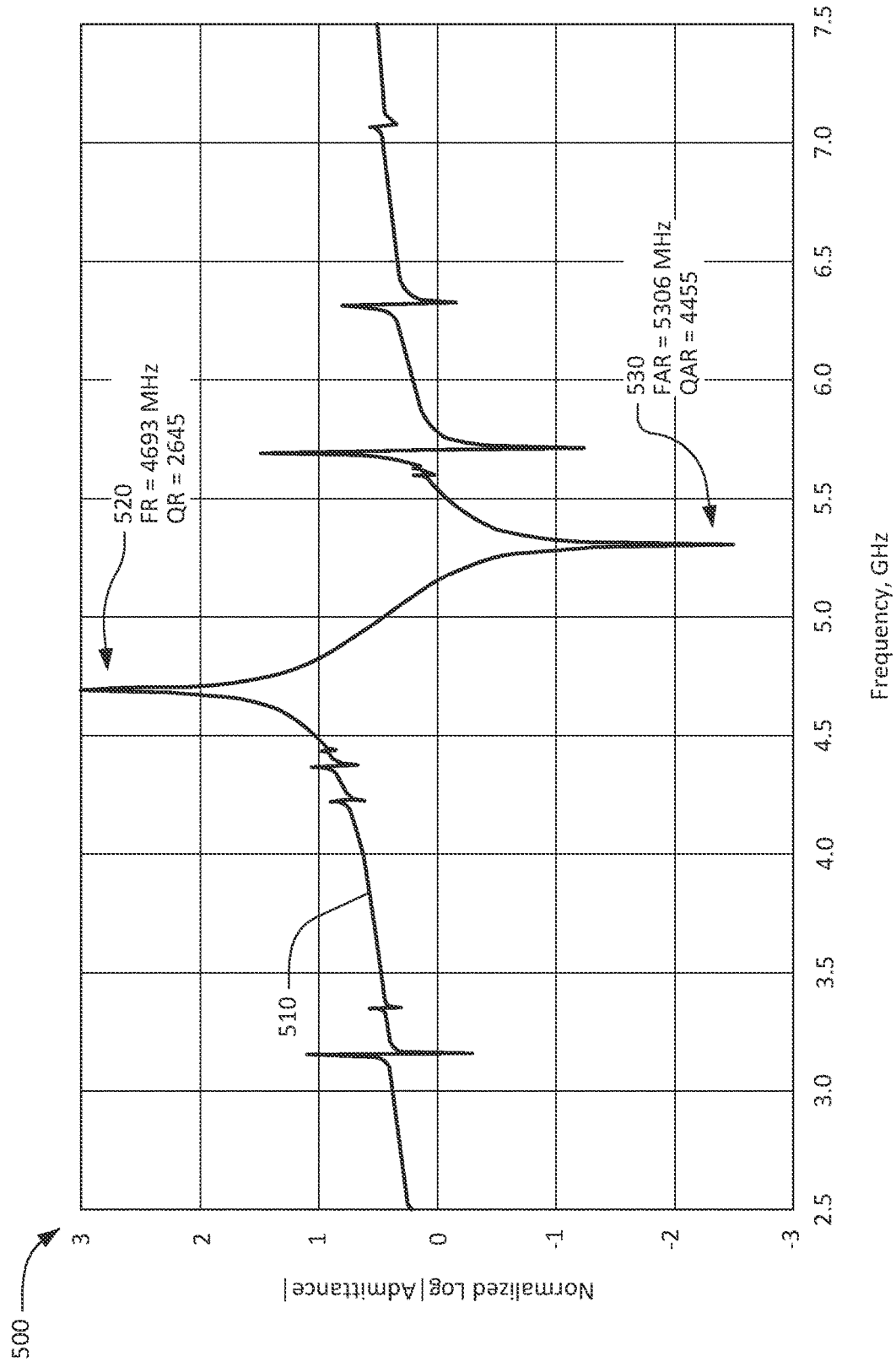
FIG. 5 is a chart of the admittance of a simulated XBAR.

FIG. 5 is a chart 500 with a plot 510 of the normalized magnitude of the admittance (on a logarithmic scale) as a function of frequency of an XBAR simulated using finite element method (FEM) simulation techniques. In the simulated XBAR, the piezoelectric plate is Z-cut (i.e. Z axis normal to the plate) lithium niobate. The IDT fingers are aluminum. The IDT is oriented such that the y-axis of the piezoelectric plate is normal to the IDT fingers. The substrate supporting the piezoelectric plate is silicon with a cavity formed completely through the silicon (as shown in FIG. 1). Losses in the piezoelectric plate and IDT fingers were simulated using standard material parameters. The simulated physical dimensions are as follows: ts=400 nm; tfd=0; tbd=0; tm=100 nm; p=5 µm; w=500 nm. The admittance is normalized for a single pair of IDT fingers and an aperture of 1 meter. The admittance of an XBAR with N IDT fingers and an aperture A (in m) can be estimated by multiplying the normalized admittance provided in FIG. 5 by (N−1)·A.

The simulated XBAR exhibits a resonance at a frequency FR 520 of 4693 MHz and an anti-resonance at a frequency FAR 530 of 5306 MHz. The Q at resonance QR is 2645 and the Q at anti-resonance QAR is 4455. The absolute difference between FAR and FR is about 600 MHz, and the fractional difference is about 0.12. The acoustic coupling can be roughly estimated to 24%. Secondary resonances are evident in the admittance curve at frequencies below FR and above FAR.

Acoustic RF filters usually incorporate multiple acoustic resonators. Typically, these resonators have at least two different resonance frequencies. For example, an RF filter using the well-known "ladder" filter architecture includes shunt resonators and series resonators. A shunt resonator typically has a resonance frequency below the passband of the filter and an anti-resonance frequency within the passband. A series resonator typically has a resonance frequency within the pass band and an anti-resonance frequency above the passband. In many filters, each resonator has a unique resonance frequency. An ability to obtain different resonance frequencies for XBARs made on the same piezoelectric plate greatly simplifies the design and fabrication of RF filters using XBARs.

Figure 6:
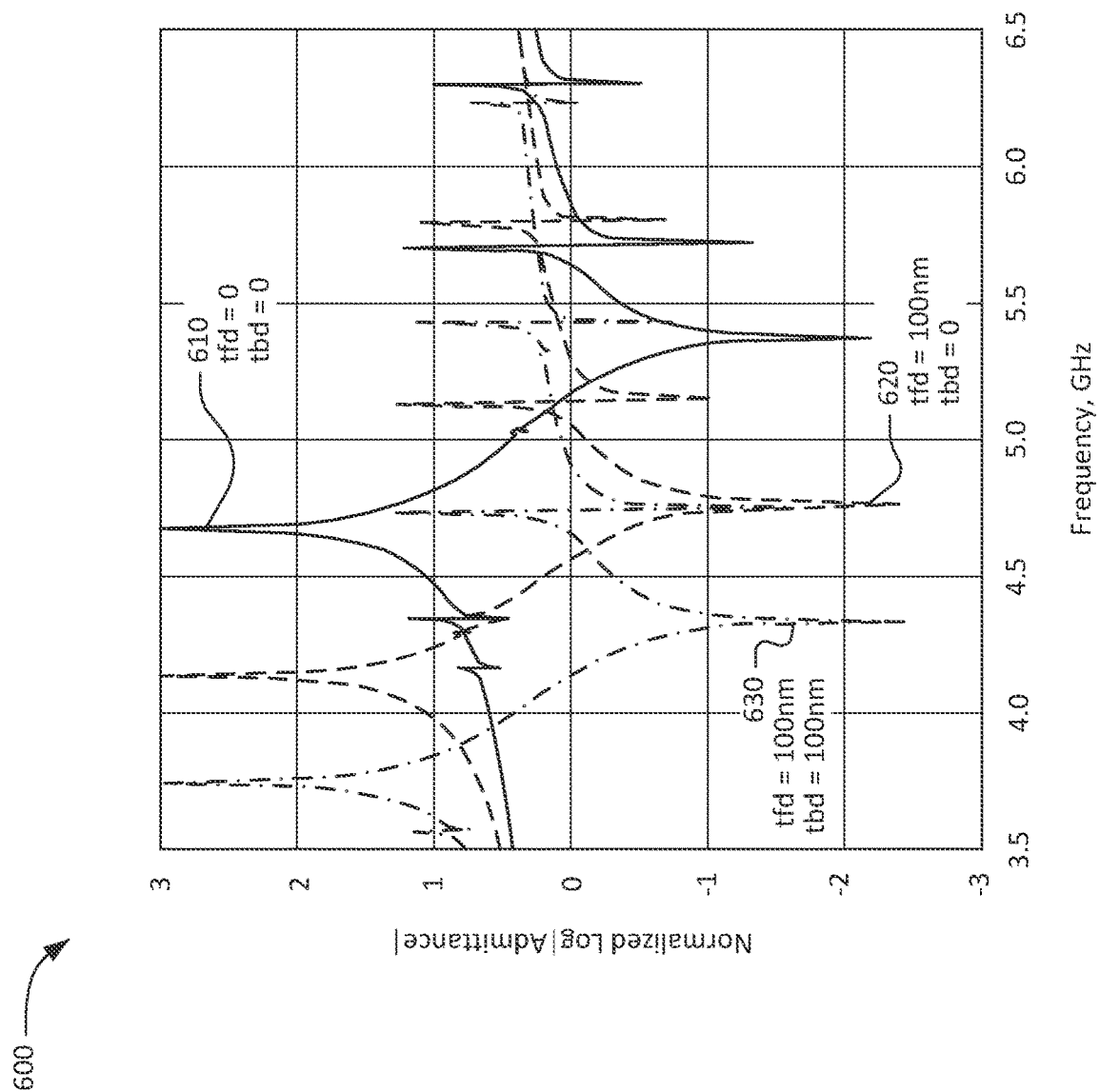
FIG. 6 is a chart comparing the admittances of three simulated XBARs with different dielectric layers.

FIG. 6 is a graph 600 comparing the normalized admittances, as functions of frequency, of three XBARs with different dielectric layers. The admittance data, which is presented on a log scale, results from two-dimensional simulation of a XBAR structure using the same materials and dimensions (except for the dielectric layers) as the previous example. The admittance is normalized for a single pair of IDT fingers and an aperture of 1 m. The solid line 610 is a plot of the normalized admittance per unit aperture for an XBAR with tfd=tbd=0 (i.e. an XBAR without dielectric layers). The normalized admittance of this XBAR is comparable to the normalized admittance plot in FIG. 5, with slight differences due to the different simulation methodologies. The dashed line 620 is a plot of the normalized admittance for an XBAR with 100 nm of SiO2 on the front surface of the piezoelectric slab between the IDT fingers (tfd=100 nm and tbd=0). The addition of the SiO₂ layer on the front surface of the piezoelectric plate shifts the resonance frequency down by about 500 MHz, or about 11%, compared to the XBAR with no dielectric layers. The dash-dot line 630 is a plot of the normalized admittance for an XBAR with 100 nm of SiO₂ over the front surface of the piezoelectric slab between the IDT fingers and 100 nm of SiO₂ on the back surface of the piezoelectric slab (tfd=tbd=100 nm). The addition of the SiO₂ layers on both surfaces of the piezoelectric plate shifts the resonance frequency down by about 900 MHz, or 20%, compared to the XBAR with no dielectric layers.

Figure 7:
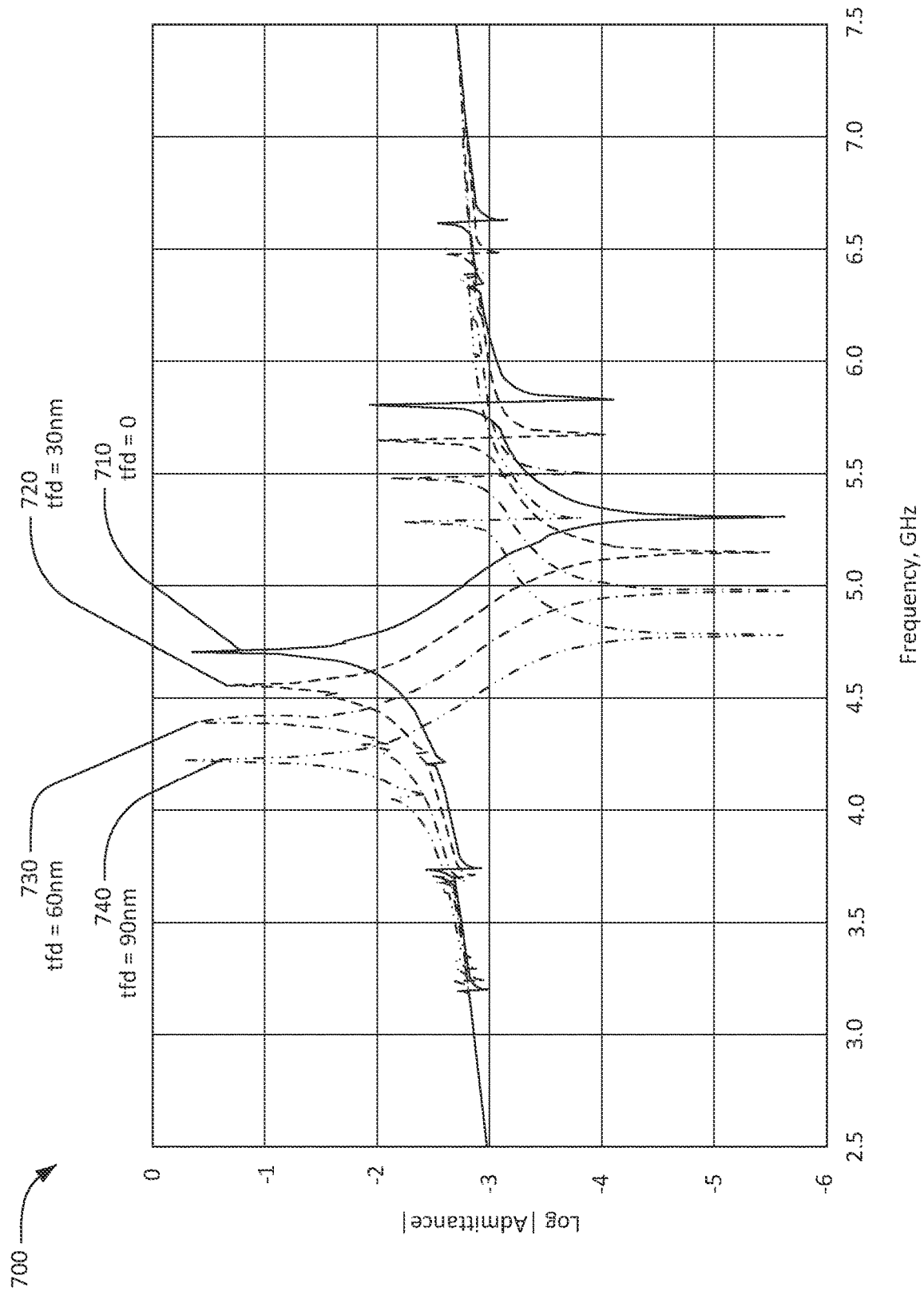
FIG. 7 is a chart comparing the admittances of four simulated XBARs with different dielectric layer thicknesses.

FIG. 7 is a graph 700 comparing the admittances, as functions of frequency, of four XBARs with different front-side dielectric layer thicknesses. The admittance data results from three-dimensional simulation of XBARs with the following parameter: ts=400 nm; tfd=0, 30, 60, 90 nm; tbd=0; tm=100 nm; p=4.2 µm; w=500 nm; AP=20 µm; and N (total number of IDT fingers)=51. The substrate is Z-cut lithium niobate, the IDT conductors are aluminum, and the dielectric layers are SiO2.

The solid line 710 is a plot of the admittance of an XBAR with tfd=0 (i.e. an XBAR without dielectric layers). The dashed line 720 is a plot of the admittance of an XBAR with tfd=30 nm. The addition of the 30 nm dielectric layer reduces the resonant frequency by about 145 MHz compared to the XBAR without dielectric layers. The dash-dot line 730 is a plot of the admittance of an XBAR with tfd=60 nm. The addition of the 60 nm dielectric layer reduces the resonant frequency by about 305 MHz compared to the XBAR without dielectric layers. The dash-dot-dot line 740 is a plot of the admittance of an XBAR with tfd=90 nm. The addition of the 90 nm dielectric layer reduces the resonant frequency by about 475 MHz compared to the XBAR without dielectric layers. The frequency and magnitude of the secondary resonances are affected differently than the primary shear-mode resonance.

Importantly, the presence of the dielectric layers of various thicknesses has little or no effect on the piezoelectric coupling, as evidenced by the nearly constant frequency offset between the resonance and anti-resonance of each XBAR.

Figure 8:
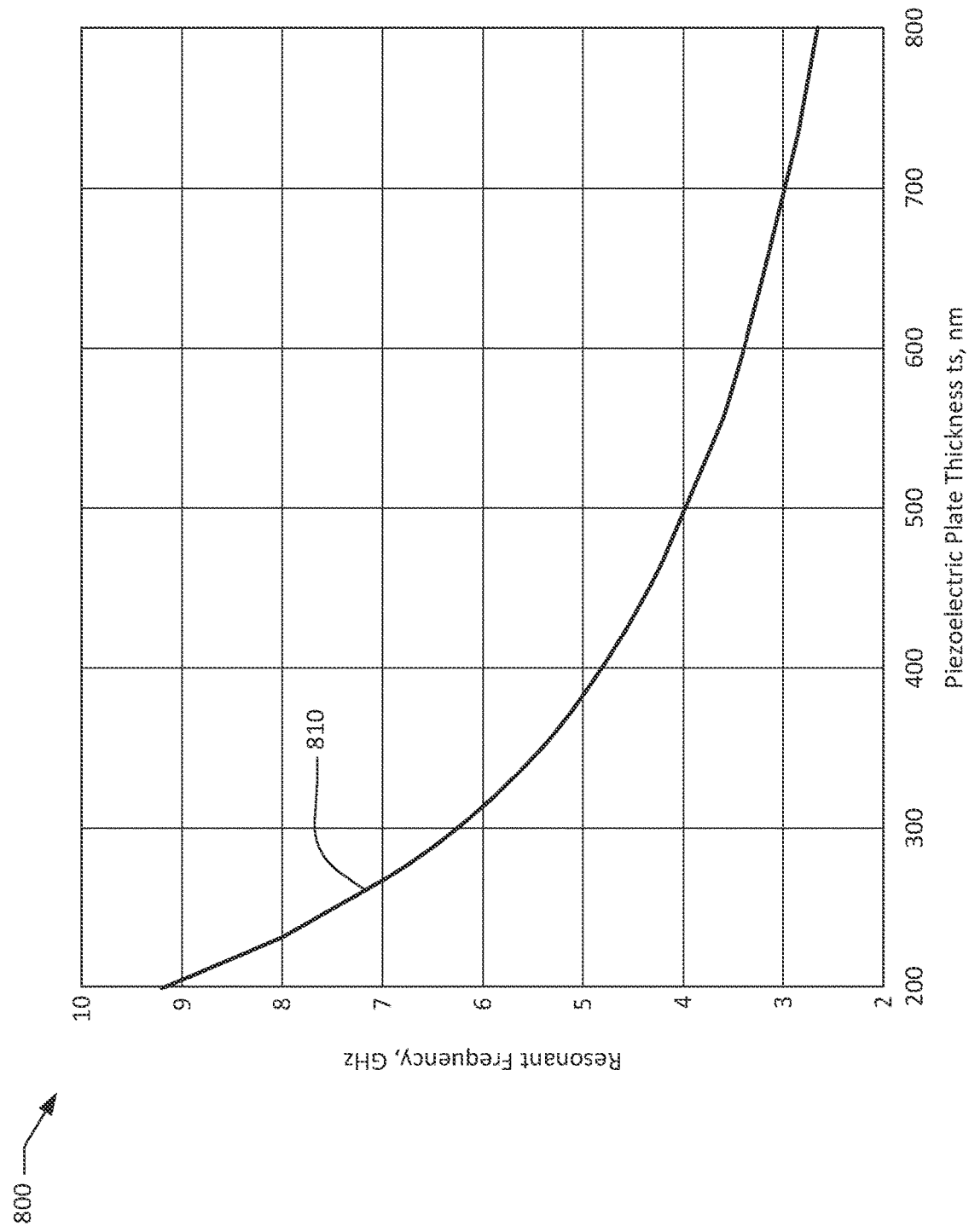
FIG. 8 is a plot showing the effect of piezoelectric plate thickness on resonance frequency of an XBAR.
Figure 9:
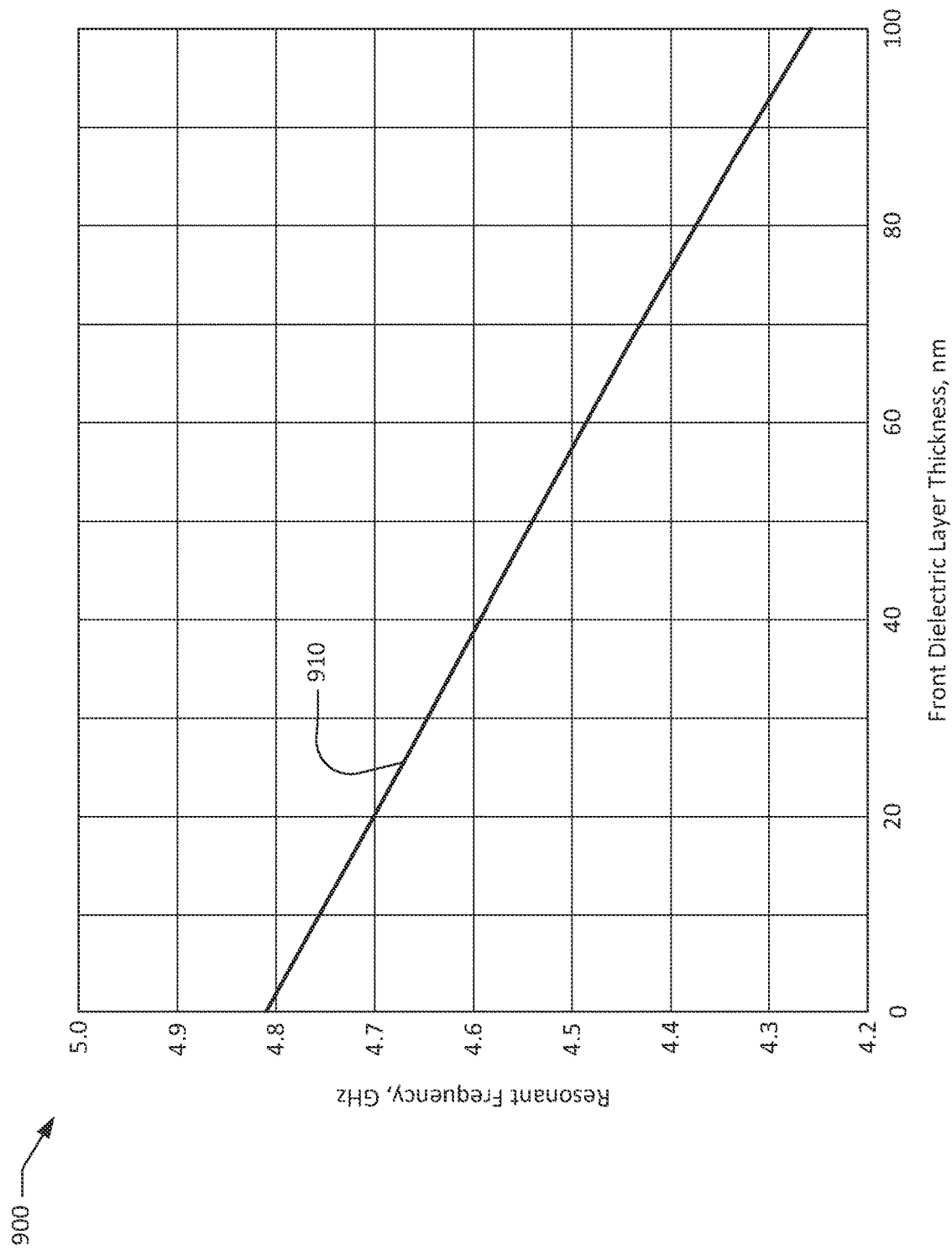
FIG. 9 is a plot showing the effect of front dielectric layer thickness on resonance frequency of an XBAR.
Figure 10:
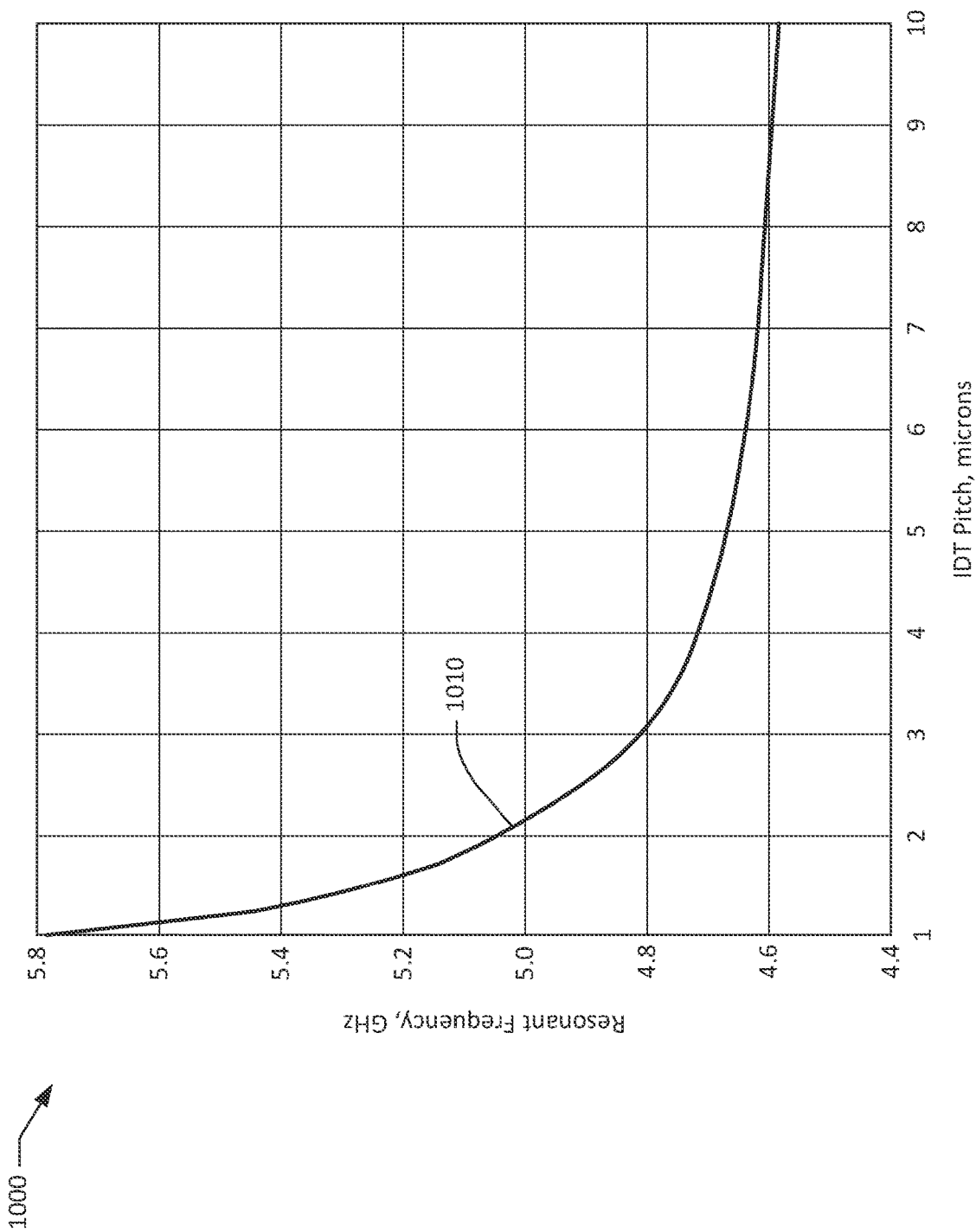
FIG. 10 is a plot showing the effect of IDT finger pitch on resonance frequency of an XBAR.

FIG. 8, FIG. 9, and FIG. 10 are graphs showing the dependence, determined by simulation, of resonant frequency on XBAR physical characteristics. Specifically, FIG. 8 is a graph 800 with curve 810 showing resonant frequency as a function of piezoelectric plate thickness ts with IDT finger pitch p=3 microns and no front-side or back-side dielectric layer (tfd=tbd=0). FIG. 9 is a graph 900 with curve 910 showing resonant frequency as a function of front-side dielectric layer thickness tfd for piezoelectric plate thickness ts=400 nm and IDT finger pitch p=3 microns. FIG. 10 is a graph 1000 with curve 1010 showing resonant frequency as a function of IDT finger pitch p with piezoelectric plate thickness ts=400 nm and tfd=tbd=0. In all cases, the piezoelectric substrate is Z-cut lithium niobate and the IDT fingers were aluminum with a width w=500 nm and thickness tm=100 nm. The front-side dielectric layer, when present, is SiO2. The range of pitch p from 1.0 to 10.0 microns is equivalent to 2.5 to 25 times the piezoelectric plate thickness and 2 to 20 time the IDT finger width.

Figure 11:
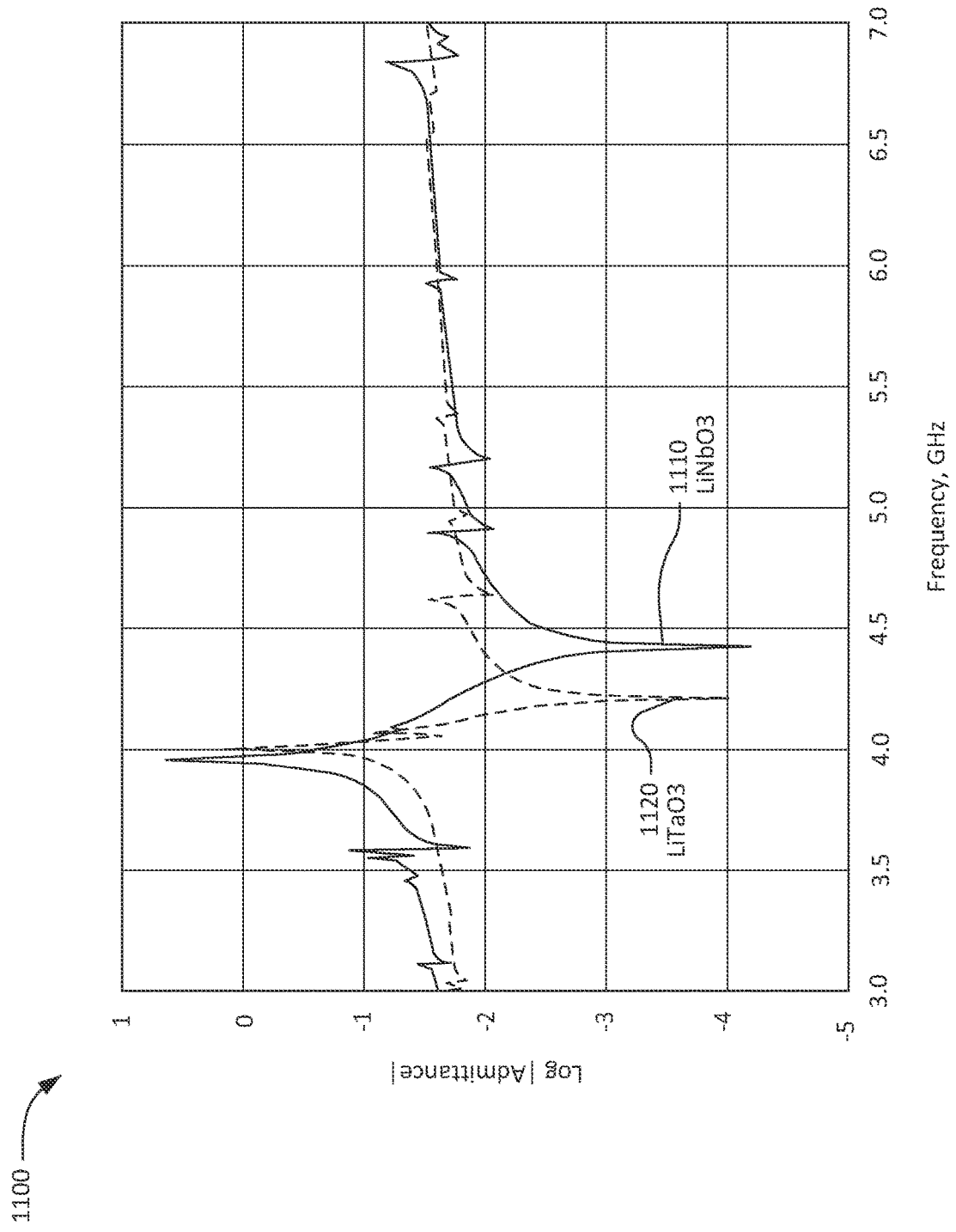
FIG. 11 is a chart comparing the admittances of XBARs on LiNbO3 and LiTaO3 plates.

FIG. 11 is a graph 1100 comparing the admittances, as functions of frequency, of two XBARs with different piezoelectric plate materials. The admittance data results from three-dimensional simulation of XBARs with the following parameter: ts=415 nm; tfd=120 nm; tbd=0; tm=460 nm; p=4.5 µm; w=700 nm; AP=71 µm; and N (total number of IDT fingers)=221. The substrate is Z-cut lithium niobite or Z-cut lithium tantalate, the IDT electrodes are copper, and the dielectric layer is SiO2.

The solid line 1110 is a plot of the admittance of an XBAR on a lithium niobate plate. The dashed line 1120 is a plot of the admittance of an XBAR on a lithium tantalate plate. Notably, the difference between the resonance and anti-resonance frequencies of the lithium tantalate XBAR is about 5%, or half of the frequency difference of the lithium niobate XBAR. The lower frequency difference of the lithium tantalate XBAR is due to the weaker piezoelectric coupling of the material. The measured temperature coefficient of the resonance frequency of a lithium niobate XBAR is about −71 parts-per-million per degree Celsius. The temperature coefficient of frequency (TCF) for lithium tantalate XBARs will be about half that of lithium niobate XBARs. Lithium tantalate XBARs may be used in applications that do not require the large filter bandwidth possible with lithium niobate XBARs and where the reduced TCF is advantageous.

Figure 12:
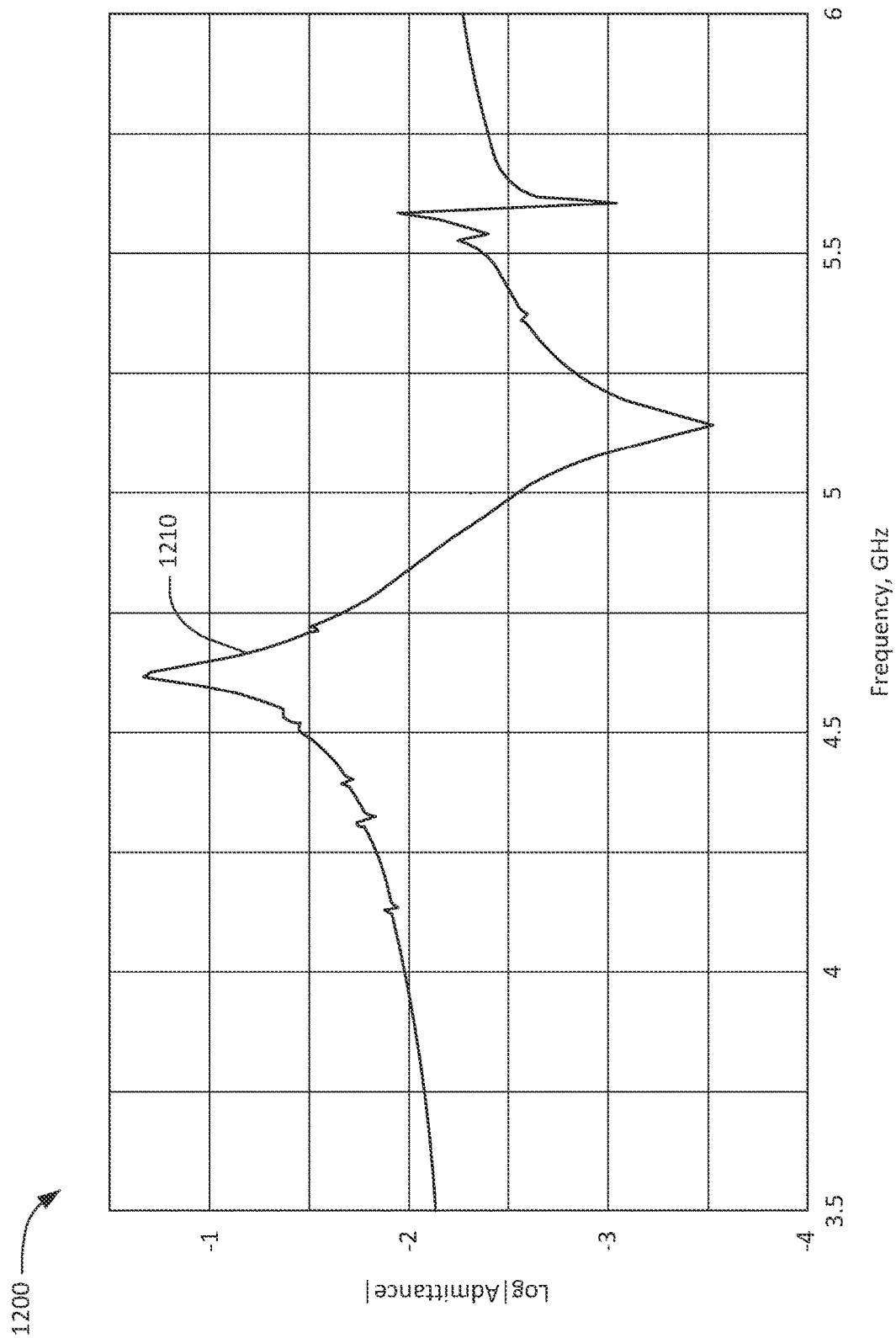
FIG. 12 is a chart of the measured admittance of an XBAR.

FIG. 12 is a chart 1200 showing the measured admittance of an experimental XBAR fabricated on a Z-cut lithium niobate plate with a thickness of 400 nm. The IDT had a pitch of 5 μm, an aperture of 40 μm, and 101 IDT fingers. The IDT fingers were aluminum with a thickness of 100 nm. The device did not include dielectric layers. The solid line 1210 is the magnitude of admittance as a function of frequency. The resonance frequency is 4617 MHz and the anti-resonance frequency is 5138 MHz. The frequency difference is 521 MHz or more than 11% of the resonance frequency. The measured data has not been corrected for the effects of the measurement system. Typically, correcting for the measurement system increases the anti-resonance frequency and the different between the anti-resonance and resonance frequencies.

Figure 13:
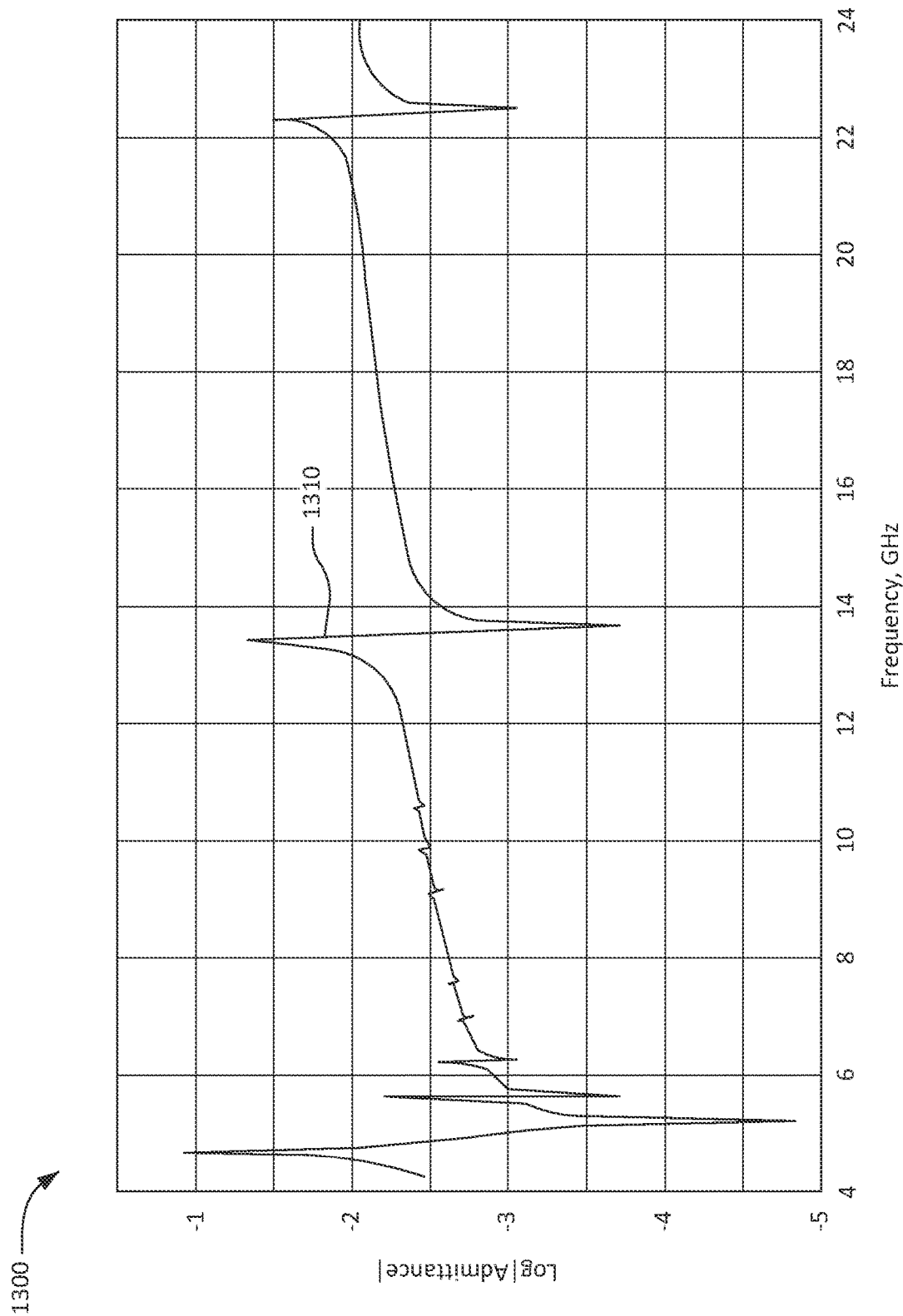
FIG. 13 is another chart of the measured admittance of an XBAR.

FIG. 13 is a chart 1300 showing the measured admittance of another experimental XBAR fabricated on a Z-cut lithium niobate plate with a thickness of 400 nm. The IDT had a pitch of 5 μm, an aperture of 20 μm, and 51 fingers. The IDT fingers were aluminum with a thickness of 100 nm. The device did not include dielectric layers. The solid line 1310 is the magnitude of admittance as a function of frequency. The third and fifth harmonics of the primary XBAR resonance are visible at about 13.5 GHz and 22.5 GHz, respectively. Resonances have been measured in other XBARs at frequencies as high as 60 GHz.

Figure 14:
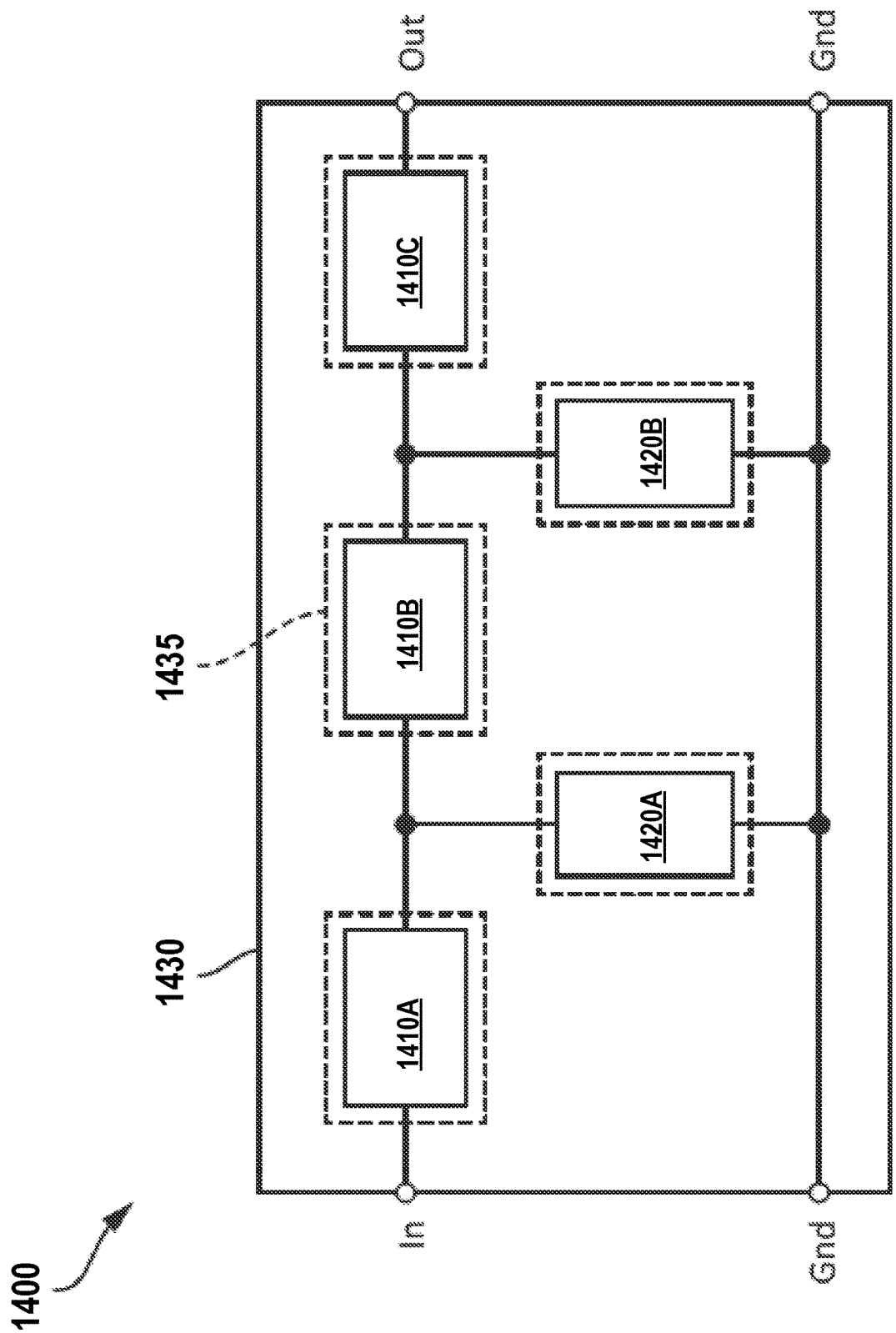
FIG. 14 is a schematic circuit diagram and layout of a filter using XBARs.

FIG. 14 is a schematic circuit diagram for a high frequency band-pass filter 1400 using XBARs. The filter 1400 has a conventional ladder filter architecture including three series resonators 1410A, 1410B, 1410C and two shunt resonators 1420A, 1420B. The three series resonators 1410A, 1410B, and 1410C are connected in series between a first port and a second port. In FIG. 14, the first and second ports are labeled "In" and "Out", respectively. However, the filter 1400 is bidirectional and either port and serve as the input or output of the filter. The two shunt resonators 1420A, 1420B are connected from nodes between the series resonators to ground. All the shunt resonators and series resonators are XBARs.

The three series resonators 1410A, B, C and the two shunt resonators 1420A, B of the filter 1400 are formed on a single plate 1430 of piezoelectric material bonded to a silicon substrate (not visible). Each resonator includes a respective IDT (not shown), with at least the transducer area of the IDT disposed over a cavity in the substrate. In this and similar contexts, the term "respective" means "relating things each to each", which is to say with a one-to-one correspondence.

In FIG. 14, the cavities are illustrated schematically as the dashed rectangles (such as the rectangle 1435). In this example, each IDT is disposed over a respective cavity. In other filters, the IDTs of two or more resonators may be disposed over a single cavity.

In a ladder band-pass filter circuit, the anti-resonance frequencies of the series resonators 1410A, 1410B, 1410C are typically above the upper edge of the filter passband. Since each series resonator has very low admittance, approaching an open circuit, at its anti-resonance frequency, the series resonators create transmission minimums (common called "transmission zeros") above the passband. The resonance frequencies of the shunt resonators are typically below the lower band edge of the filter pass band. Since each shunt resonator has very high admittance, approaching a short circuit, at its resonance frequency, the shunt resonators create transmission minimums (common called "transmission zeros") below the passband.

In some broadband filters, a dielectric layer may be formed on the top side, the bottom side, or both sides of the diaphragms of the shunt resonators to lower the resonance frequencies of the shunt resonators relative to the anti-resonance frequencies of the series resonators.

Figure 15:
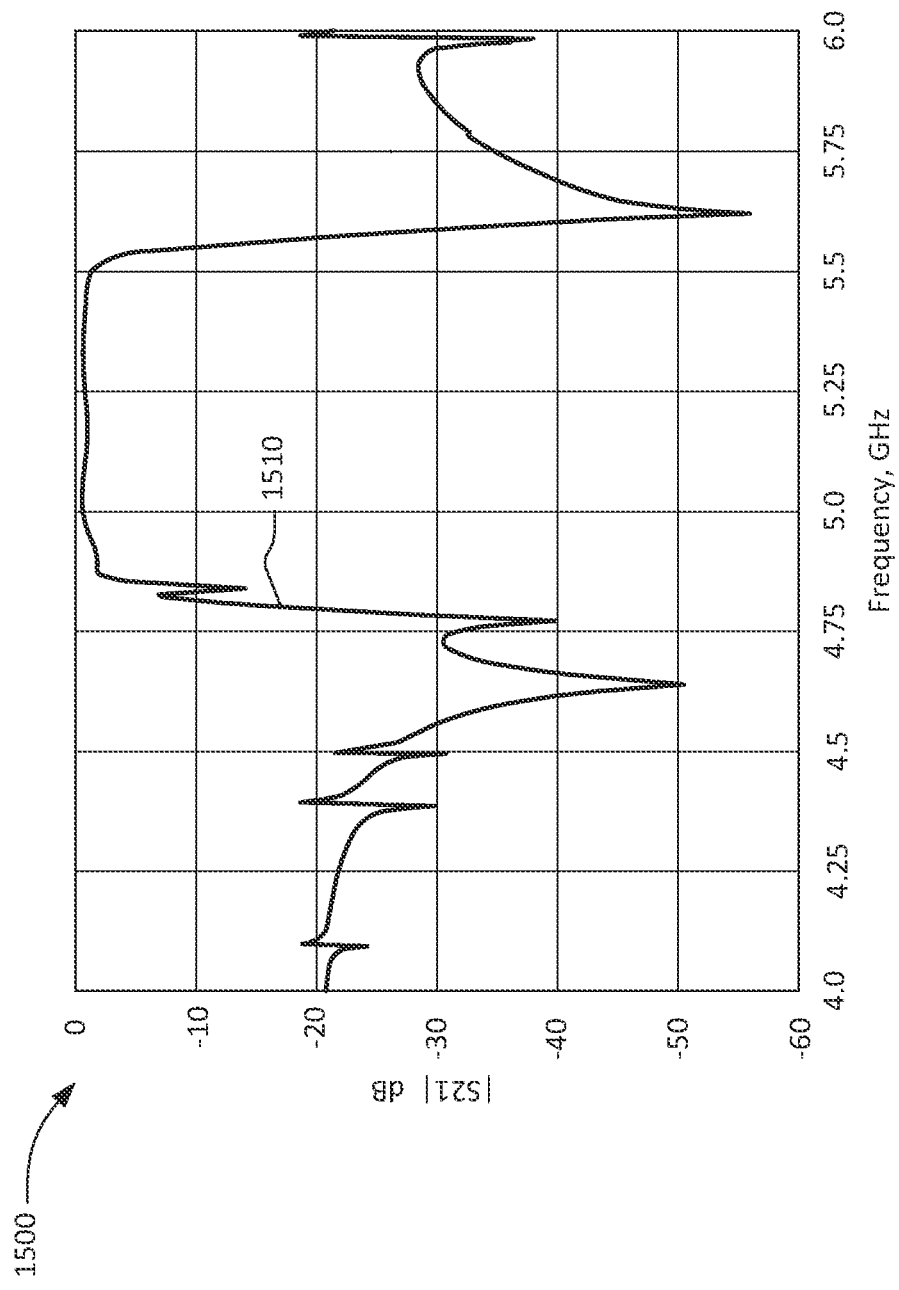
FIG. 15 is a graph of the transfer curve (S21) of an embodiment of the filter of FIG. 12.

FIG. 15 is a chart 1500 showing results from simulating a first bandpass filter incorporating five XBARs. The schematic diagram of the first filter is the same as the filter 1400 of FIG. 14. The XBARs are formed on a 0.4 micron thickness Z-cut lithium niobate plate. The substrate is silicon, the IDT conductors are aluminum, and there are no dielectric layers. The other physical parameters of the resonators are provided in the following table (all dimensions are in microns):

|           | Series Resonators |       |       | Shunt Resonators |       |
|-----------|-------|-------|-------|-------|-------|
| Parameter | 1410A | 1410B | 1410C | 1420A | 1420B |
| p         | 1.475 | 1.475 | 1.525 | 3.52  | 3.52  |
| w         | 0.53  | 0.53  | 0.515 | 0.51  | 0.51  |
| AP        | 12.8  | 8.6   | 13.8  | 33    | 40    |
| L         | 250   | 250   | 250   | 500   | 500   |

The performance of the first filter was simulated using a 3D finite element modeling tool. The curve 1510 is a plot of the magnitude of S21, the input-output transfer function, of the first filter as a function of frequency. The filter bandwidth is about 800 MHz, centered at 5.15 GHz. The simulated filter performance includes resistive and viscous losses. Tuning of the resonant frequencies of the various resonators is accomplished by varying only the pitch and width of the IDT fingers.

Figure 16:
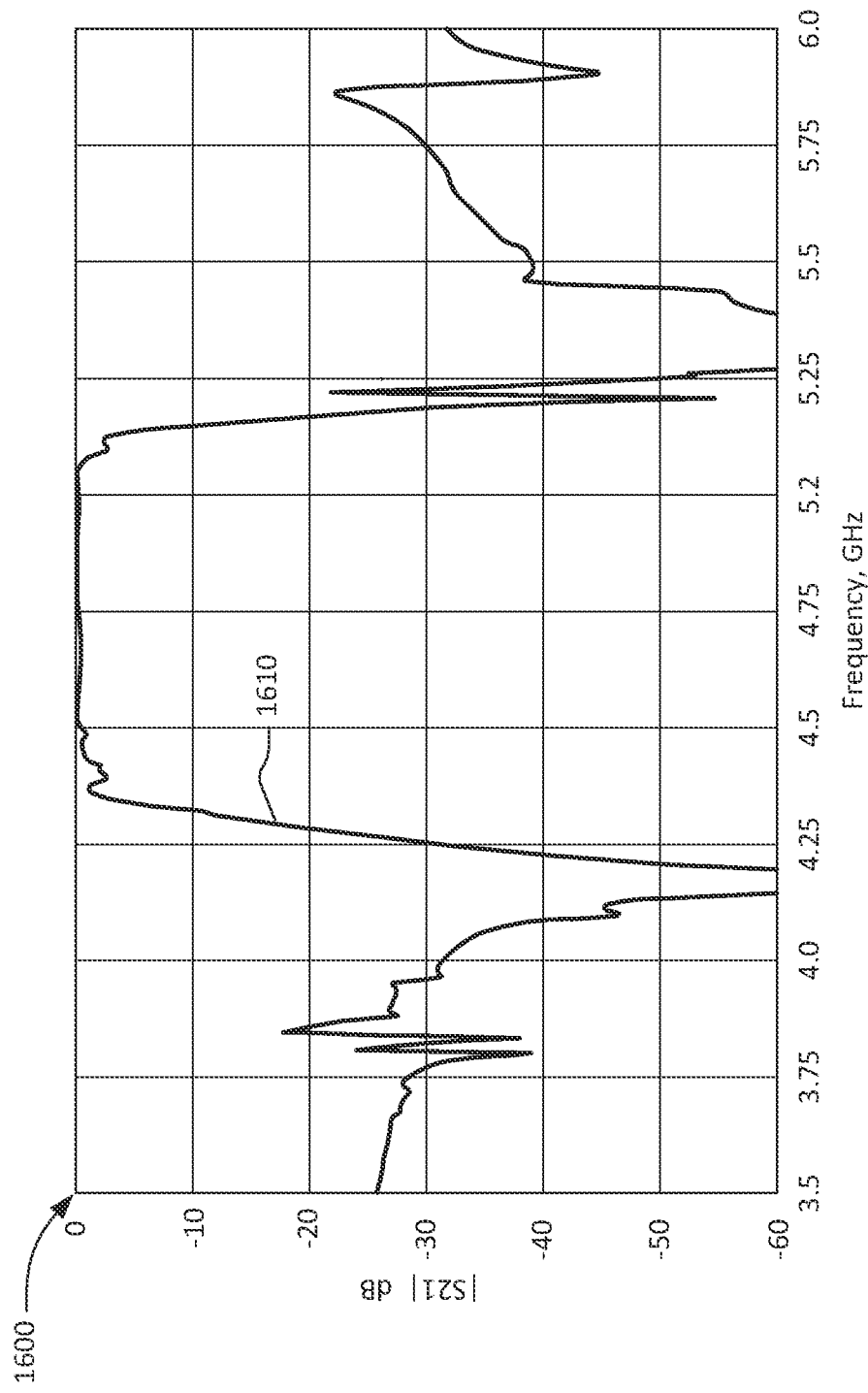
FIG. 16 is a graph of the transfer curve (S21) of another embodiment of the filter of FIG. 12.

FIG. 16 is a chart 1600 showing results from simulating a second filter using five XBARs. The schematic diagram of the second filter is the same as the filter 1400 of FIG. 14. The XBARs are formed on a Z-cut lithium niobate (0.4 μm thick) piezoelectric plate. The substrate is silicon, and the IDT electrodes are copper. Adjusting the resonant frequencies of the resonators is accomplished by varying the pitch and width of the IDT fingers and by providing a frequency-setting dielectric layer on the front side between the IDT fingers of the shunt resonators to reduce their frequencies relative to the frequencies of the series resonators. The other physical parameters of the resonators are provided in the following table (all dimensions are in microns):

| Parameter | Series Resonators | | | Shunt Resonators | |
|---|---|---|---|---|---|
| | 1410A | 1410B | 1410C | 1420A | 1420B |
| p | 4.189 | 4.07 | 4.189 | 4.2 | 4.2 |
| w | 0.494 | 0.505 | 0.494 | 0.6 | 0.6 |
| AP | 46.4 | 23.6 | 46.4 | 80.1 | 80.1 |
| L | 1000 | 1000 | 1000 | 1000 | 1000 |
| tfd | 0 | 0 | 0 | 0.106 | 0.106 |

The performance of the filter was simulated using a 3D finite element modeling tool. The curve 1610 is a plot of S21, the input-output transfer function, of the simulated filter 1400 as a function of frequency. The filter bandwidth is about 800 MHz, centered at 4.75 GHz. The simulated performance does not include resistive or viscous losses.

A first dielectric layer having a first thickness may be deposited over the IDT of the shunt resonators and a second dielectric layer having a second thickness may be deposited over the IDT of the series resonators. The first thickness may be greater than the second thickness. A difference between an average resonance frequency of the series resonators and an average resonance frequency of the shunt resonators is determined, in part, by a difference between the first thickness and the second thickness.

The first and second filters (whose S21 transmission functions are shown in FIG. 15 and FIG. 16) are examples of filters using XBARs. A filter may use more or fewer than two shunt resonators, more or fewer than three series resonators, and more or fewer than five total resonators. A filter may use reactive components, such as capacitors, inductors, and delay lines in addition to XBARs. Further fine tuning of the individual resonators of these filters may improve filter performance.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A filter device comprising:
    a substrate including a base and an intermediate dielectric layer;
    a piezoelectric layer coupled to the substrate, the piezoelectric layer comprising a first diaphragm over a first cavity that at least partially extends in the intermediate dielectric layer of the substrate and a second diaphragm over a second cavity that at least partially extends in the intermediate dielectric layer of the substrate;
    a first interdigital transducer (IDT) on a surface of the piezoelectric layer and having interleaved fingers on the first diaphragm;
    a second interdigital transducer (IDT) on the surface of the piezoelectric layer and having interleaved fingers on the second diaphragm;
    a first dielectric layer and between the interleaved fingers of the first IDT; and
    a second dielectric layer between the interleaved fingers of the second IDT, wherein a thickness of the first dielectric layer is greater than a thickness of the second dielectric layer.

2. The filter device of claim 1, wherein the the first IDT is configured such that radio frequency signals applied to the first IDT excites a primarily shear acoustic mode in the first diaphragm and the second IDT is configured such that radio frequency signals applied to the second IDT excites a primarily shear acoustic mode in the second diaphragm.

3. The filter device of claim 1, wherein the thickness of the first dielectric layer is measured in a direction perpendicular to the surface of the piezoelectric layer and the thickness of the second dielectric layer is measured in the direction perpendicular to the surface of the piezoelectric layer.

4. The filter device of claim 1, wherein the piezoelectric layer is one of lithium niobate and lithium tantalate.

5. The filter device of claim 4, wherein the piezoelectric layer is one of Z-cut, rotated Z-cut, and rotated Y-cut.

6. The filter device of claim 1, wherein the first dielectric layer is disposed over and between the interleaved fingers of the first IDT and the second dielectric layer is disposed over and between the interleaved fingers of the second IDT.

7. A ladder filter circuit comprising:
    a first resonator comprising:
        a first piezoelectric diaphragm,
        a first interdigital transducer (IDT) having interleaved fingers on a surface of the first piezoelectric diaphragm, and
        a first dielectric layer on the first IDTA and between the interleaved fingers of the first IDT; and
    a second resonator comprising:
        a second piezoelectric diaphragm,
        a second interdigital transducer (IDT) having interleaved fingers on a surface of the second piezoelectric diaphragm, and
        a second dielectric layer on the second IDT and between the interleaved fingers of the second IDT,
    wherein a thickness of the first dielectric layer is greater than a thickness of the second dielectric layer.

8. The ladder filter circuit of claim 7, wherein a difference between a resonance frequency of the first resonator and a resonance frequency of the second resonator is configured, at least in part, by a difference between the first thickness and the second thickness.

9. The ladder filter circuit of claim 7, wherein the first piezoelectric diaphragm and the second piezoelectric diaphragm are portions of a same piezoelectric layer.

10. The ladder filter circuit of claim 7, wherein the first piezoelectric diaphragm and the second piezoelectric diaphragm have a same thickness.

11. The ladder filter circuit of claim 7, wherein:
the first piezoelectric diaphragm and the first IDT are configured such that a radio frequency signal applied to the first IDT excites a primary shear acoustic mode in the first piezoelectric diaphragm, and
the second piezoelectric diaphragm and the second IDT are configured such that a radio frequency signal applied to the second IDT excites a primary shear acoustic mode in the second piezoelectric diaphragm.

12. The ladder filter circuit of claim 7, wherein the first piezoelectric diaphragm and the second piezoelectric diaphragm are each one of lithium niobate and lithium tantalate.

13. The ladder filter circuit of claim 12, wherein the first piezoelectric diaphragm and the second piezoelectric diaphragm are each one of Z-cut, rotated Z-cut, and rotated Y-cut.

14. The ladder filter circuit of claim 7, wherein the thickness of the first dielectric layer is measured in a direction perpendicular to the surface of the first piezoelectric diaphragm and the thickness of the second dielectric layer is measured in a direction perpendicular to the surface of the second piezoelectric diaphragm.

15. A filter device comprising:
a support substrate;
an intermediate dielectric layer disposed on the support substrate and having a plurality of cavities disposed therein;
a piezoelectric layer attached to the intermediate dielectric layer, the intermediate dielectric layer having a plurality of diaphragms over the plurality of cavities, respectively;
a conductor pattern on a surface of the piezoelectric layer, the conductor pattern comprising a plurality of interdigital transducers (IDTs) of a respective plurality of acoustic resonators including a shunt resonator and a series resonator, interleaved fingers of each of the plurality of IDTs on a diaphragm of the plurality of diaphragms;
a first dielectric layer having a first thickness over the shunt resonator; and
a second dielectric layer having a second thickness on the series resonator, the first thickness being greater than the second thickness.

16. The filter device of claim 15, wherein the piezoelectric layer and the plurality of IDTs are configured such that radio frequency signals applied to the plurality of IDTs excite primary shear acoustic modes in the respective diaphragms.

17. The filter device of claim 15, wherein the respective thicknesses of the first and second dielectric layers are measured in a direction perpendicular to the surface of the piezoelectric layer.

18. The filter device of claim 15, wherein a thickness between the opposing surfaces of the piezoelectric layer is greater than or equal to 200 nm and less than or equal to 800 nm.

19. The device of claim 18, wherein a pitch of the interleaved fingers of each IDT is greater than or equal to 2.5 times the thickness of the at least one piezoelectric layer and less than or equal to 25 times the thickness of the at least one piezoelectric layer.

20. The filter device of claim 19, wherein:
the interleaved fingers of each IDT have a respective width, and
the pitch of each IDT is greater than or equal to 2 times and less than or equal to 20 times the respective width.

* * * * *